United States Patent
Oganesian

(10) Patent No.: US 8,604,576 B2
(45) Date of Patent: Dec. 10, 2013

(54) LOW STRESS CAVITY PACKAGE FOR BACK SIDE ILLUMINATED IMAGE SENSOR, AND METHOD OF MAKING SAME

(75) Inventor: Vage Oganesian, Sunnyvale, CA (US)

(73) Assignee: Opitz, Inc., Palo Alto, CA (US)

( * ) Notice: Subject to any disclaimer, the term of this patent is extended or adjusted under 35 U.S.C. 154(b) by 229 days.

(21) Appl. No.: 13/186,357

(22) Filed: Jul. 19, 2011

(65) Prior Publication Data
US 2013/0020665 A1    Jan. 24, 2013

(51) Int. Cl.
*H01L 31/0232*    (2006.01)

(52) U.S. Cl.
USPC ............. 257/432; 257/E31.126; 257/E31.127

(58) Field of Classification Search
USPC .............. 257/432, E31.127, E31.126; 438/66
See application file for complete search history.

(56) References Cited

U.S. PATENT DOCUMENTS

| | | | |
|---|---|---|---|
| 6,777,767 B2 | 8/2004 | Badehi | |
| 6,894,358 B2* | 5/2005 | Leib et al. | 257/414 |
| 6,972,480 B2* | 12/2005 | Zilber et al. | 257/678 |
| 7,033,664 B2 | 4/2006 | Zilber et al. | |
| 7,071,521 B2* | 7/2006 | Leib et al. | 257/414 |
| 7,157,742 B2 | 1/2007 | Badehi | |
| 7,192,796 B2* | 3/2007 | Zilber et al. | 438/26 |
| 7,265,440 B2 | 9/2007 | Zilber et al. | |
| 7,268,410 B1* | 9/2007 | Hopper et al. | 257/531 |
| 7,285,834 B2* | 10/2007 | Leib et al. | 257/414 |
| 7,364,933 B2* | 4/2008 | Kim | 438/65 |
| 7,495,341 B2 | 2/2009 | Zilber et al. | |
| 7,642,629 B2 | 1/2010 | Zilber et al. | |
| 7,781,781 B2* | 8/2010 | Adkisson et al. | 257/84 |
| 7,791,199 B2* | 9/2010 | Grinman et al. | 257/747 |
| 7,875,948 B2* | 1/2011 | Hynecek et al. | 257/447 |
| 7,901,989 B2* | 3/2011 | Haba et al. | 438/110 |
| 7,919,348 B2* | 4/2011 | Akram et al. | 438/64 |
| 7,935,568 B2* | 5/2011 | Oganesian et al. | 438/106 |
| 7,936,062 B2* | 5/2011 | Humpston et al. | 257/704 |
| 7,973,397 B2* | 7/2011 | Hsu et al. | 257/680 |
| 8,115,267 B2* | 2/2012 | Miura | 257/434 |
| 8,310,036 B2* | 11/2012 | Haba et al. | 257/678 |
| 8,314,482 B2* | 11/2012 | Chen et al. | 257/686 |
| 8,405,196 B2* | 3/2013 | Haba et al. | 257/686 |
| 2004/0251525 A1 | 12/2004 | Zilber | |
| 2005/0104179 A1 | 5/2005 | Zilber | |

(Continued)

OTHER PUBLICATIONS

U.S. Appl. No. 13/157,193, filed Jun. 2011, Oganesian.

(Continued)

*Primary Examiner* — David Vu
*Assistant Examiner* — Caleb Henry
(74) *Attorney, Agent, or Firm* — DLA Piper LLP (US)

(57) ABSTRACT

An image sensor package includes an image sensor chip and crystalline handler. The image sensor chip includes a substrate, and a plurality of photo detectors and contact pads at the front surface of the substrate. The crystalline handler includes opposing first and second surfaces, and a cavity formed into the first surface. A compliant dielectric material is disposed in the cavity. The image sensor front surface is attached to the crystalline substrate handler second surface. A plurality of electrical interconnects each include a hole aligned with one of the contact pads, with a first portion extending from the second surface to the cavity and a second portion extending through the compliant dielectric material, a layer of insulation material formed along a sidewall of the first portion of the hole, and conductive material extending through the first and second portions of the hole and electrically coupled to the one contact pad.

12 Claims, 6 Drawing Sheets

(56) References Cited

U.S. PATENT DOCUMENTS

| | | |
|---|---|---|
| 2005/0205977 A1 | 9/2005 | Zilber |
| 2006/0222300 A1* | 10/2006 | Frenzel et al. .................. 385/88 |
| 2007/0031137 A1* | 2/2007 | Bogdan et al. ................ 396/114 |
| 2007/0138498 A1 | 6/2007 | Zilber |
| 2007/0190691 A1 | 8/2007 | Humpston |
| 2007/0190747 A1 | 8/2007 | Humpston |
| 2008/0012115 A1 | 1/2008 | Zilber |
| 2008/0017879 A1 | 1/2008 | Zilber |
| 2008/0073734 A1* | 3/2008 | Kong ............................. 257/432 |
| 2008/0083976 A1 | 4/2008 | Haba |
| 2008/0083977 A1 | 4/2008 | Haba |
| 2008/0099864 A1* | 5/2008 | Wu et al. ....................... 257/432 |
| 2008/0099900 A1 | 5/2008 | Oganesian |
| 2008/0099907 A1* | 5/2008 | Oganesian et al. ........... 257/693 |
| 2008/0116544 A1 | 5/2008 | Grinman |
| 2008/0116545 A1 | 5/2008 | Grinman |
| 2008/0150121 A1 | 6/2008 | Oganesian et al. |
| 2008/0156518 A1* | 7/2008 | Honer et al. ................... 174/250 |
| 2008/0157250 A1* | 7/2008 | Yang et al. .................... 257/433 |
| 2008/0191297 A1* | 8/2008 | Yang et al. .................... 257/432 |
| 2008/0191300 A1* | 8/2008 | Nystrom et al. .............. 257/432 |
| 2008/0197435 A1* | 8/2008 | Yang et al. .................... 257/432 |
| 2008/0237762 A1* | 10/2008 | Swain et al. ................... 257/432 |
| 2008/0246136 A1 | 10/2008 | Haba et al. |
| 2008/0265350 A1* | 10/2008 | Wu et al. ....................... 257/432 |
| 2009/0014822 A1* | 1/2009 | Poo et al. ....................... 257/432 |
| 2009/0085134 A1* | 4/2009 | Park et al. ..................... 257/432 |
| 2009/0115047 A1 | 5/2009 | Haba |
| 2009/0146148 A1* | 6/2009 | Pyo ................................. 257/59 |
| 2009/0152658 A1* | 6/2009 | Bolken et al. ................. 257/432 |
| 2009/0160065 A1 | 6/2009 | Haba |
| 2009/0212381 A1 | 8/2009 | Crisp |
| 2009/0253226 A1* | 10/2009 | Kong .............................. 438/65 |
| 2010/0001305 A1* | 1/2010 | Lin et al. ......................... 257/99 |
| 2010/0053407 A1 | 3/2010 | Crisp |
| 2010/0159621 A1* | 6/2010 | Kimura et al. .................. 438/27 |
| 2010/0167447 A1* | 7/2010 | Kim ................................ 438/59 |
| 2010/0181636 A1* | 7/2010 | Takayama et al. ............ 257/432 |
| 2010/0225006 A1 | 9/2010 | Haba |
| 2010/0230812 A1 | 9/2010 | Oganesian |
| 2010/0258712 A1* | 10/2010 | Wiese et al. ............... 250/237 R |
| 2011/0012259 A1 | 1/2011 | Grinman |
| 2011/0031629 A1 | 2/2011 | Haba |
| 2011/0033979 A1 | 2/2011 | Haba |
| 2011/0042770 A1* | 2/2011 | Brady ............................ 257/432 |
| 2011/0044367 A1* | 2/2011 | Budd et al. .................. 372/50.21 |
| 2011/0044369 A1* | 2/2011 | Andry et al. ............. 372/50.124 |
| 2011/0049696 A1 | 3/2011 | Haba |
| 2011/0147871 A1* | 6/2011 | Utsumi et al. ................. 257/432 |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |

OTHER PUBLICATIONS

U.S. Appl. No. 13/157,193, filed Jun. 9, 2011, Oganesian, Vage.
U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.

* cited by examiner

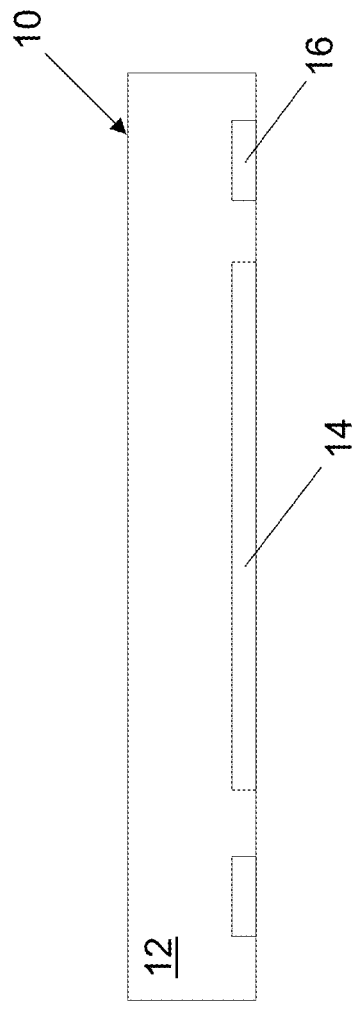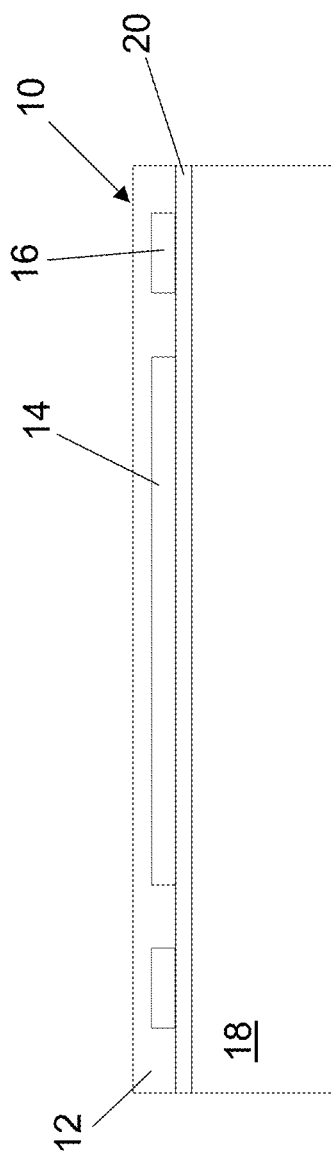

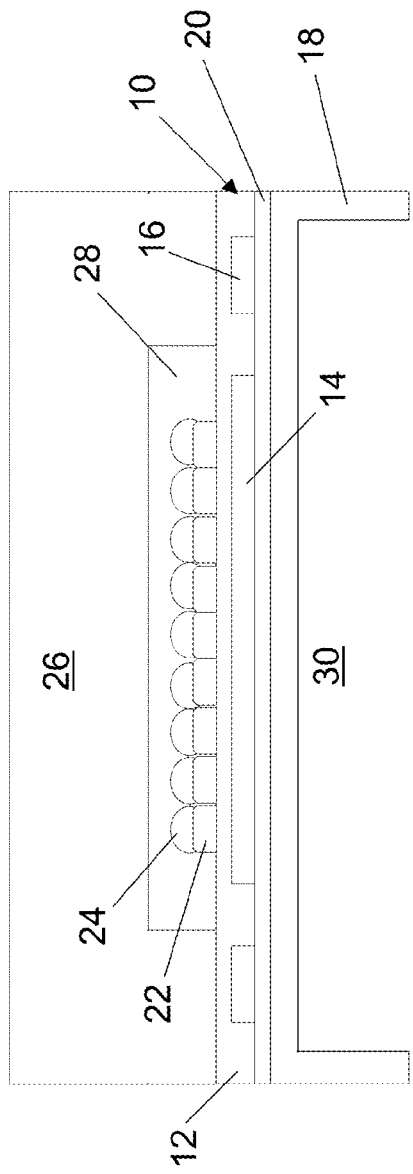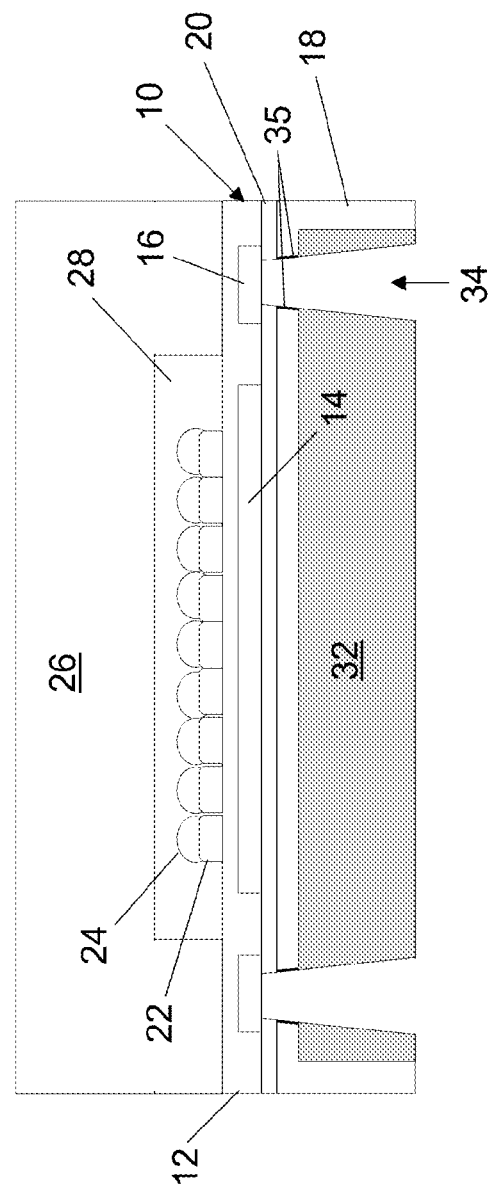

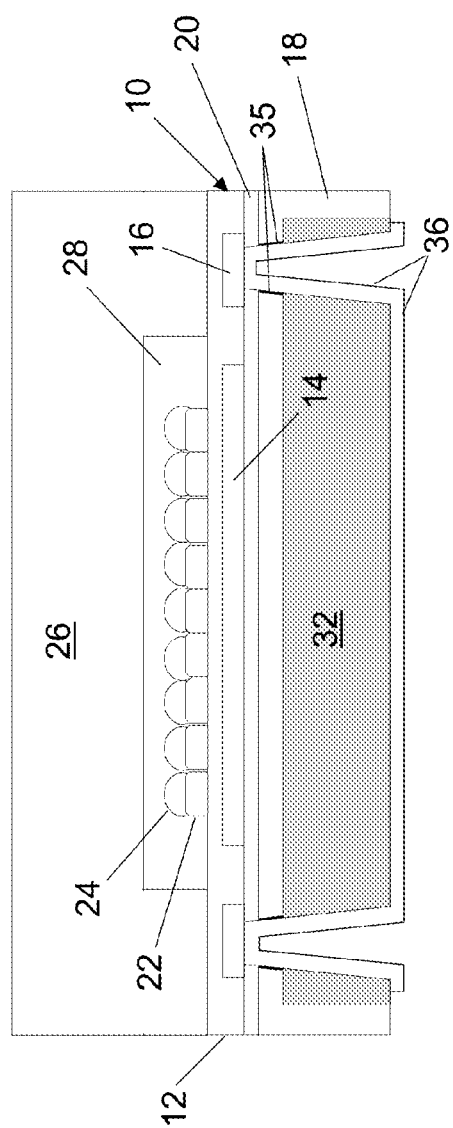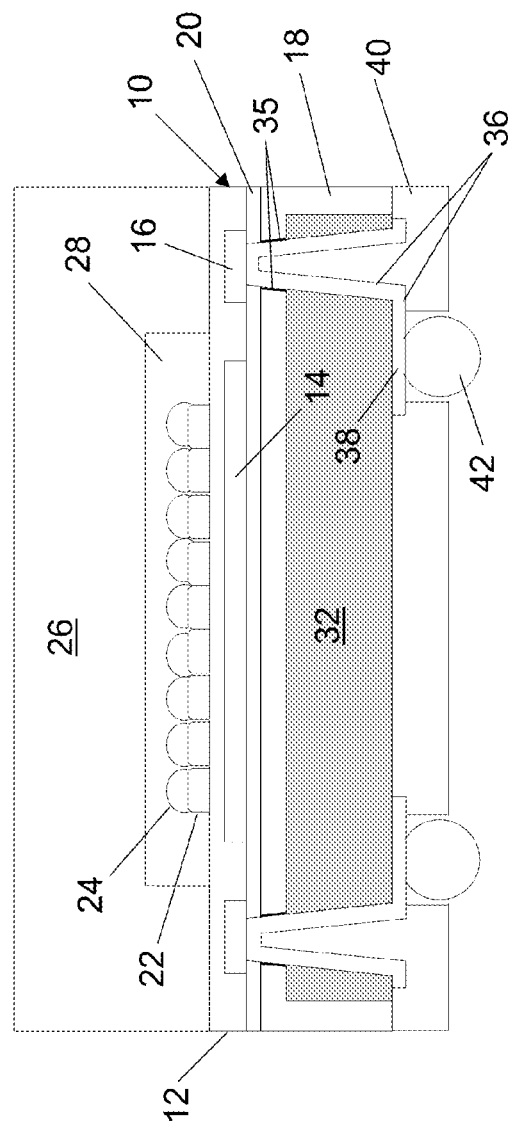

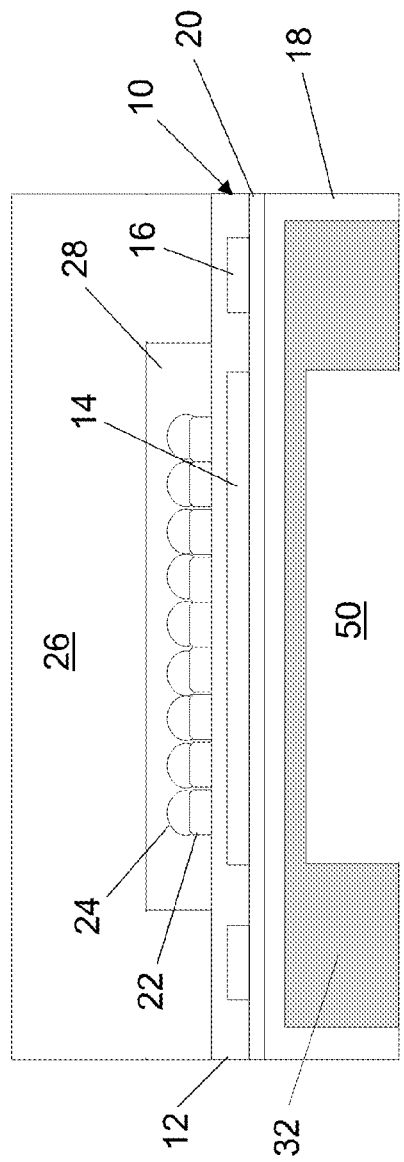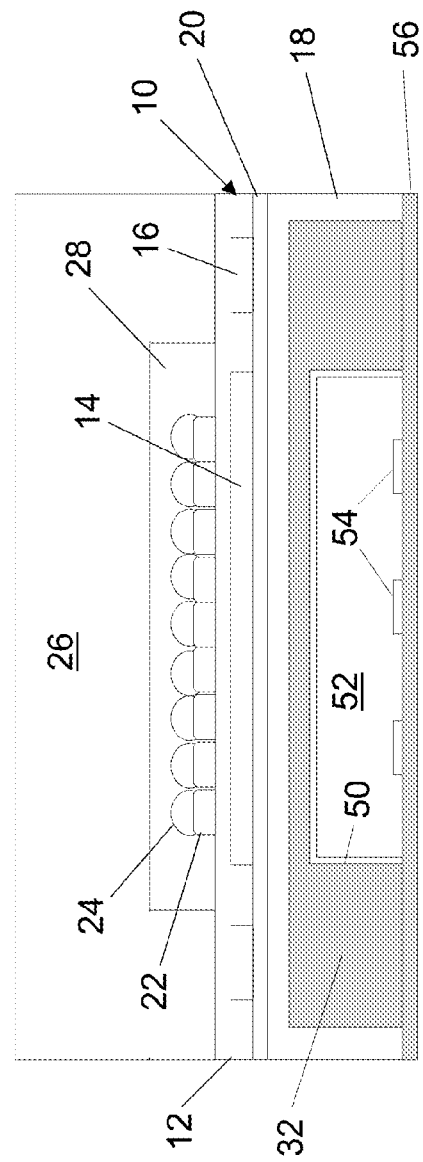

LOW STRESS CAVITY PACKAGE FOR BACK SIDE ILLUMINATED IMAGE SENSOR, AND METHOD OF MAKING SAME

FIELD OF THE INVENTION

The present invention relates to packaging of microelectronic devices, and more particularly to a packaging of optical semiconductor devices.

BACKGROUND OF THE INVENTION

The trend for semiconductor devices is smaller integrated circuit (IC) devices (also referred to as chips), packaged in smaller packages (which protect the chip while providing off chip signaling connectivity). One example are image sensors, which are IC devices that include photo-detectors which transform incident light into electrical signals (that accurately reflect the intensity and color information of the incident light with good spatial resolution).

One image sensor type is the front side illuminated (FSI) image sensor, which has photo-detectors formed on the silicon chip, over which circuitry is built up. Color filters and micro-lens are added on top of the circuitry. With FSI image sensors, the light passes through the layer(s) of circuitry before reaching the photo-detectors. One limitation of FSI image sensors is that the circuitry layer(s) limit the aperture of each pixel. As the pixel size shrinks due to demands for higher number of pixels and smaller chip sizes, the ratio of pixel area to the overall sensor area decreases, which reduces the quantum efficiency (QE) of the sensor.

Another type of image sensor is the back side illuminated (BSI) image sensor. The BSI image sensor is configured so that the light enters through the back (substrate side) of the chip. The light passes through the silicon substrate and to the photo-detectors, without having to pass through any circuitry layers. The advantage of BSI image sensors is that the circuitry layers are avoided and thus need not be formed with gaps sufficient to allow light to pass to each photo detector. However, as optical paths become shorter with the use of BSI sensors, the micro-lenses become thicker (i.e. to achieve shorter focal lengths for focusing in shorter distances.

Presently, chip-on-board (COB) and Shellcase Wafer Level CSP processes are the most dominant packaging and assembly processes for FSI image sensor architecture. However, as the market moves from FSI to BSI sensors, where the contact pads and imaging areas now disposed on the opposite sides of the chip/wafer, the COB and Shellcase WLCSP technologies will face substantial challenges in packaging and assembling such BSI sensors.

BRIEF SUMMARY OF THE INVENTION

The present invention is a novel wafer level, low stress package for BSI image sensors. The image sensor package includes an image sensor chip and crystalline handler. The image sensor chip includes a substrate with front and back opposing surfaces, a plurality of photo detectors formed at the front surface, and a plurality of contact pads formed at the front surface which are electrically coupled to the photo detectors. The crystalline handler has opposing first and second surfaces, and a cavity formed into the first surface, wherein a compliant dielectric material is disposed in the cavity and wherein the image sensor chip substrate front surface is attached to the crystalline substrate handler second surface. The crystalline handler includes a plurality of electrical interconnects each comprising a hole aligned with one of the contact pads, with a first portion extending from the second surface to the cavity and a second portion extending through the compliant dielectric material, a layer of insulation material formed along a sidewall of the first portion of the hole, and conductive material extending through the first and second portions of the hole, wherein the conductive material is electrically coupled to the one contact pad.

A method of forming an image sensor package includes providing an image sensor chip (that includes a substrate with front and back opposing surfaces, a plurality of photo detectors formed at the front surface, and a plurality of contact pads formed at the front surface which are electrically coupled to the photo detectors), providing a crystalline handler having opposing first and second surfaces, attaching the image sensor chip substrate front surface to the crystalline handler second surface, forming a cavity into the first surface, forming a compliant dielectric material in the cavity, and forming a plurality of electrical interconnects. Each electrical interconnect is formed by forming a hole with a first portion extending from the second surface to the cavity and a second portion extending through the compliant dielectric material, wherein the hole is aligned with one of the contact pads, forming a layer of insulation material along a sidewall of the first portion of the hole, and forming conductive material that extends through the first and second portions of the hole, wherein the conductive material is electrically coupled to the one contact pad.

Other objects and features of the present invention will become apparent by a review of the specification, claims and appended figures.

BRIEF DESCRIPTION OF THE DRAWINGS

FIGS. 1-6 are cross sectional side views of a semiconductor packaging structure showing in sequence the steps in the processing of the packaging structure for a BSI image sensor.

FIGS. 7-11 are cross sectional side views of an alternate embodiment of the semiconductor packaging structure showing in sequence the steps in the processing of the packaging structure for a BSI image sensor with integrated processor.

DETAILED DESCRIPTION OF THE INVENTION

Figure 9:
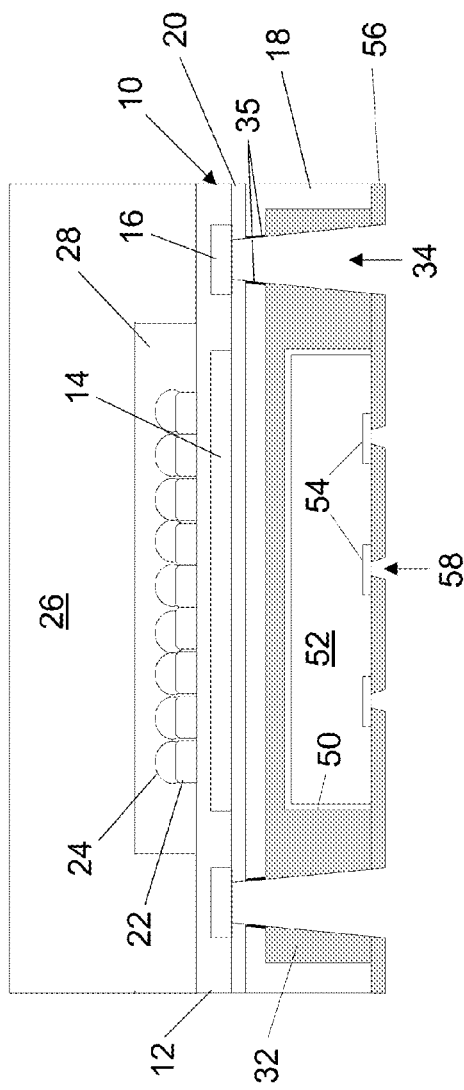

The present invention is wafer level, low stress package solution that is ideal for BSI image sensors. The formation of the low stress package solution is described below.

The formation process begins with a BSI image sensor chip 10 as shown in FIG. 1, which includes a substrate 12 on which a plurality of photo detectors 14 (and supporting circuitry) are formed, along with contact pads 16. The photo detectors 14 (and supporting circuitry) and contact pads 16 are formed at the downwardly facing (front) surface of substrate 12 as shown in FIG. 1. Preferably, all the supporting circuitry is formed below photo detectors 14 so that it does not obstruct light traveling through substrate 10 from reaching photo detectors 14. The contact pads 16 are electrically connected to the photo detectors (and/or their supporting circuitry) for providing off chip signaling. Each photodetector converts light energy entering that back side (upwardly facing surface in FIG. 1) of the chip to a voltage signal. Additional circuitry on the chip may be included to amplify the voltage, and/or convert it to digital data. BSI image sensors of this type are well known in the art, and not further described herein.

The BSI image sensor chip 10 is mounted to a crystalline handler 18 by bonding the surface of substrate 12 containing the photo detectors 14 (and supporting circuitry) and contact pads 16 to a surface of the crystalline handler 18, as shown in FIG. 2. The bonding is accomplished by dispensing a bonding material 20 between the handler 18 and substrate 12, and then pressing them together. The bonding material can include a polymer glue, polyimide, a low temperature melting glass, etc. A preferred, non-limiting technique can include dispensing a polyimide dielectric 20 between the handler 18 and substrate 12, spinning the handler 18 and substrate 12 for conformal spreading of the polyimide 20 between the two wafers, and heated curing (e.g. 450° C. depending on material properties). If not done already, the substrate 12 may also be thinned by a silicon etch (e.g. down to a thickness as low as about 50 µm, with a photo detector 14 thickness as low as about 5-10 µm). The resulting structure is shown in FIG. 2.

Color filters 22 and microlenses 24 are mounted on the back surface of substrate 12 (i.e. the opposite surface on which the photo detectors 14 are formed). An anti-reflective coating can also be applied to or included on microlenses 24. A glass cover 26 is then attached to the substrate 12 (and over the filters/microlenses 22/24). Cover 26 includes a preformed cavity 28 to accommodate and seal filters/microlenses 22/24. Attachment of glass cover 26 is preferably implemented by dispensing a thin layer of epoxy (i.e. ~1 µm) followed by low temperature bonding with pressure. Next, a cavity 30 is formed in the handler 18. Cavity 30 can be formed by the use of a laser, a plasma etching process, a sandblasting process, a mechanical milling process, or any other similar method. Preferably cavity 30 is formed by photo-lithography plasma etching, which includes forming a layer of photo resist on the handler 18, patterning the photo resist layer to expose a select portion of handler 18, and then performing a plasma etch process (e.g. using a SF6 plasma) to remove the exposed portion of the handler 18 to form the cavity 30. Preferably, the cavity extends no further than ¾ of the crystalline substrate thickness, or at least leaves a minimum thickness at the thinnest portion of the cavity of around 50 µm. The plasma etch can be anisotropic, tapered, isotropic, or combinations thereof. The resulting structure is shown in FIG. 3.

Cavity 30 is then filled with a compliant dielectric material 32, using for example a spin coating process, a spray process, a dispense process, an electrochemical deposition process, a lamination process, or any other similar method. A compliant dielectric is a relatively soft material (e.g. solder mask) that exhibits compliance in all three orthogonal directions, and can accommodate the coefficient of thermal expansion (CTE) mismatch between the crystalline substrate (~2.6 ppm/° C.) and Cu (~17 ppm/° C.) interconnect. Compliant dielectric material 32 is preferably a polymer, such as BCB (Benzocyclobutene), solder mask, solder resist, or BT epoxy resin. Holes 34 are then formed through the dielectric material 32, the thin portion of crystalline handler 18, and bonding material 20 to expose contact pads 16. Holes 34 can be formed by using a $CO_2$ laser (e.g. spot size of about 70 µm) for larger sized holes 34, or a UV laser (e.g. spot size of about 20 µm at a wavelength of 355 nm) for smaller sized holes 34 (e.g. less than 50 µm in diameter). Laser pulse frequencies between 10 and 50 kHz at a pulse length of less than 140 ns can be used. The profile of holes 34 may be tapered, with a larger dimension at the surface through which holes 34 are formed. Preferably the minimum and maximum hole diameters are around 5 to 250 µm respectively, and the angles of the walls are between 0° and 45° relative to a direction perpendicular to the surface through which the holes 34 are formed (i.e. such that the holes 34 have smaller cross-sectional sizes at the contact pads). An insulation layer 35 is formed on the exposed portions of handler 18 inside holes 34, by thin film coating and photolithography processes. The resulting structure is shown in FIG. 4.

A metallization process for holes 34 is next performed. The metallization process preferably starts with the desmear process for removing any polymer smeared on the interior walls of the holes 34 (caused by the drilling through dielectric materials such as epoxy, polyimide, cyanate ester resins, etc). The process involves contacting the polymer smear with a mixture of gamma-butyrolactone and water to soften the polymer smear, followed by treatment with an alkaline permanganate solution to remove the softened resin, and treatment with an aqueous acidic neutralizer to neutralize and remove the permanganate residues. After desmear treatment, the initial conductive metallization layer 36 is formed on the sidewalls of holes 34, and along the bottom surface of compliant dielectric 32, by electroless copper plating. Adhesion is obtained at the plated interface by an anchor effect from the surface roughness. The resulting structure is shown in FIG. 5.

The metal layer 36 outside of holes 34 is then patterned by a photolithography process (photo resist deposition, mask exposure, selective resist removal, and metal etch) to form traces in the metal layer 36 that terminate in contact pads 38. Each contact pad 38 is electrically coupled via metal layer 36 to one of the contact pads 16 at the end of hole 34. An encapsulation insulation layer 40 is then formed over metal layer 36 (and contact pads 38 thereof) and compliant dielectric 32, via lamination, spray/spin coating, etc. Layer 40 can be a solder mask, BCB, E-coat, BT resin, FR4, mold compound, etc. This is followed by a selective etch back of layer 40 to expose contact pads 38. The selective etch back can be performed by a photo-lithographic process to selectively remove those portions of layer 40 over contact pads 38. BGA interconnects 42 are then formed on contact pads 38 using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto bond pads. The resulting structure is shown in FIG. 6.

The wafer level, low stress package for a BSI image sensor, and it method of manufacture, as described above and illustrated in the figures, have several advantages. First, holes 34 and metal layer 36 therein form electrical interconnects that transfer signals from the BSI image sensor contact pads, through the package, and to BGA interconnects 42. Second, forming holes 34 through dielectric 32 and the thinned portion of handler 18 is easier and requires less expensive equipment and processing compared to forming longer holes through the entire width of crystalline silicon handler 18 (which requires expensive silicon etching equipment and processing). Third, mechanical stresses are reduced because the thermal and mechanical characteristics of dielectric material 32 better match that of the PCB to which the package will be mounted, as compared to if the package was primarily crystalline silicon through its entire thickness. Fourth, dielectric material 32 additionally provides superior mechanical and electrical insulation. Fifth, forming metal interconnections (i.e. metal layer 36) via metal plating avoids using sputtering or evaporation equipment, which can be costly, and the plating process is less likely to damage insulation materials 32 and 35. Sixth, by forming the walls of holes 34 with a slant, it reduces potentially damaging inducing stress on the crystalline handler that can result from 90 degree corners. Seventh, the slanted sidewalls of holes 34 also mean there are no negative angle areas that can result in gaps formed with dielectric material 32. Eighth, by forming insulation material 32 first, and then forming metallization layer 36 thereon, metal diffusion into the crystalline handler 18 is avoided.

FIGS. 7-11 illustrate the formation of an alternate embodiment, which includes an integrated processor for the image sensor chip 10. Starting with the structure of FIG. 3, and then after the cavity 30 is filled with the dielectric material 32, a second cavity 50 is then formed in the compliant dielectric material 32. Cavity 50 can be formed by the use of a laser, a sandblasting process, a mechanical milling process, or any other similar method. Preferably cavity 50 is formed by using a laser in a manner where the cavity does not extend all the way through the compliant dielectric material 32 (so that handler 18 is not exposed in cavity 50). The resulting structure is shown in FIG. 7.

A processor IC chip 52 is then inserted into cavity 50. The IC chip 52 includes a processor integrated circuit for processing the signals from the image sensor chip 10. The IC chip 52 includes conductive contact pads 54 exposed on its bottom surface for communicating signals on and off chip. An encapsulation insulation layer 56 is then formed on the structure which encapsulates IC chip 52 inside cavity 50. Layer 56 can be a solder mask, BCB, E-coat, BT resin, FR4, mold compound, or other similar insulation materials. The resulting structure is shown in FIG. 8.

Holes 34 are then formed in a similar manner as described above with respect to FIG. 4 (through layer 56, compliant dielectric 32, handler 18, and bonding material 20 to expose contact pads 16). Insulation layer 35 on the exposed portions of handler 18 inside holes 34 is also formed as described above. Holes 58 are formed through layer 56 to expose the conductive pads 54 of processor IC chip 52 in a similar manner that holes 34 are formed. The resulting structure is shown in FIG. 9.

Figure 10:
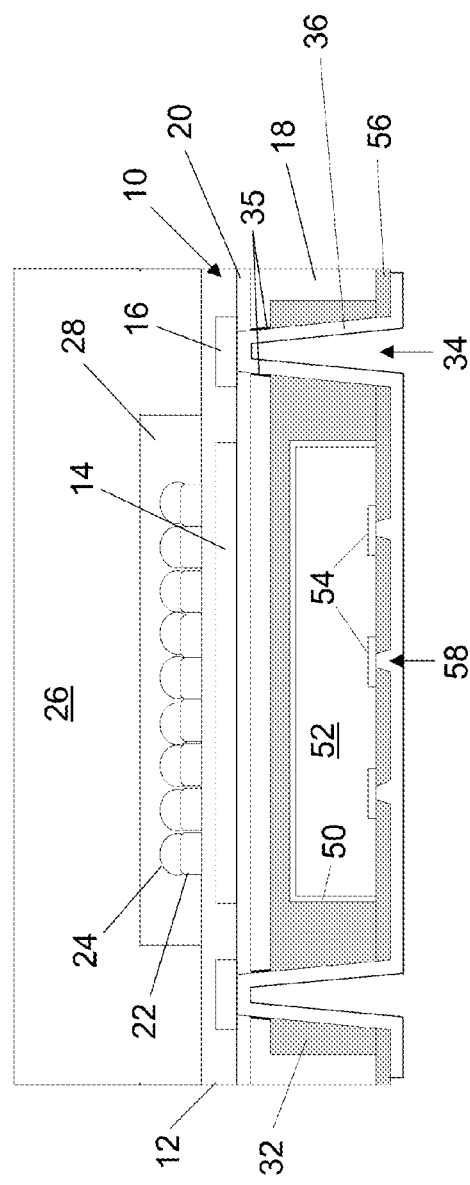
Figure 11:
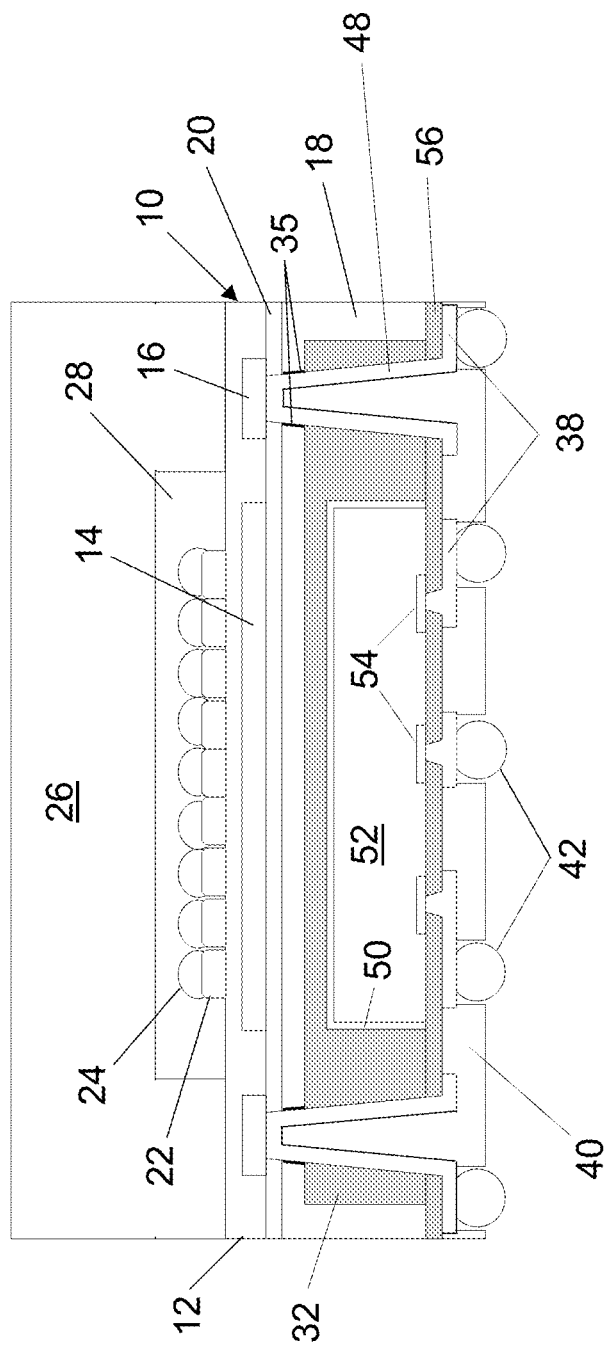

A metallization process as described above with respect to FIG. 5 is performed to form the conductive metallization layer 36. With the present embodiment, layer 36 is electrically coupled to the contact pads 16 (of the image sensor chip) and the contact pads 54 (of processor IC chip 52), as illustrated in FIG. 10. The metal layer 36 outside of holes 34 and 58 is then patterned as described above with respect to FIG. 6 to form the traces that terminate in the contact pads 38. Encapsulation insulation layer 40 is then formed, along with BGA interconnects 42, as described above in reference to FIG. 6. The resulting structure is shown in FIG. 11.

The packaging configuration described above is ideal for co-packaging a processing chip with the image sensor chip. The processing chip comprises a combination of hardware processor(s) and software algorithms that together constitute an image processor for gathering the luminance and chrominance information from the individual photodetectors 14 and using it to compute/interpolate the correct color and brightness values for each pixel. The image processor evaluates the color and brightness data of a given pixel, compares them with the data from neighboring pixels and then uses a demosaicing algorithm to reconstruct a full color image from the incomplete color samples, and produces an appropriate brightness value for the pixel. The image processor also assesses the whole picture and corrects sharpness and reduce noise of the image.

The evolution of image sensors results in the ever higher pixel count in image sensors, and the additional camera functionality, such as auto focus, zoom, red eye elimination, face tracking, etc, which requires more powerful image sensor processors that can operate in higher speeds. Photographers don't want to wait for the camera's image processor to complete its job before they can carry on shooting—they don't even want to notice some processing is going on inside the camera. Therefore, image processors must be optimized to cope with more data in the same or even shorter period of time.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order separately or simultaneously that allows the proper formation of the BSI image sensor packaging of the present invention. Single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An image sensor package, comprising:
   an image sensor chip that includes:
   a substrate with front and back opposing surfaces,
   a plurality of photo detectors formed at the front surface, and
   a plurality of contact pads formed at the front surface which are electrically coupled to the photo detectors;
   a crystalline handler having opposing first and second surfaces, and a cavity formed into the first surface, wherein a compliant dielectric material is disposed in the cavity, and wherein the image sensor chip substrate front surface is attached to the crystalline substrate handler second surface;
   the crystalline handler includes a plurality of electrical interconnects each comprising:
   a hole aligned with one of the contact pads, with a first portion extending from the second surface to the cavity and a second portion extending through the compliant dielectric material,
   a layer of insulation material formed along a sidewall of the first portion of the hole, and
   conductive material extending through the first and second portions of the hole, wherein the conductive material is electrically coupled to the one contact pad.

2. The image sensor package of claim 1, wherein the compliant dielectric material includes a polymer.

3. The image sensor package of claim 1, wherein for each of the plurality of electrical interconnects, the hole is tapered such that the hole has a larger cross-sectional dimension in the compliant material than at the second surface.

4. The image sensor package of claim 1, wherein for each of the plurality of electrical interconnects, a sidewall of the hole extends in a direction between 5° and 45° relative to a direction that is perpendicular to the first and second surfaces.

5. The image sensor package of claim 1, wherein for each of the plurality of electrical interconnects, the conductive material comprises a layer of metal extending along sidewalls of the first and second hole portions.

6. The image sensor package of claim 1, wherein each of the plurality of electrical interconnects further comprises a rounded interconnect disposed over the first surface and electrically coupled to the conductive material.

7. The image sensor package of claim 1, further comprising:
   a plurality of optical elements disposed at the back surface for filtering and focusing light incident on the back surface, wherein the photo detectors are configured to receive light passing through the optical elements and the substrate.

8. The image sensor package of claim 1, further comprising:
   a glass cover attached to the back surface that extends over the optical elements.

9. The image sensor package of claim 1, wherein the compliant dielectric material completely fills the cavity.

10. The image sensor package of claim 1, further comprising:
    a second cavity formed in the dielectric material; and
    a processor IC chip disposed in the second cavity and configured to process signals from the image sensor chip, wherein the processor IC chip includes a plurality of contact pads.

11. The image sensor package of claim 10, further comprising:
    a second layer of insulation material that extends over the processor IC chip and the first surface; and
    a plurality of holes each extending through the second layer of insulation material exposing one of the contact pads of the processor IC chip.

12. The image sensor package of claim 11, further comprising:
    a plurality of rounded interconnects each disposed over and electrically coupled to one of the contact pads of the processor IC chip.

* * * * *